United States Patent
Yoshizawa

(10) Patent No.: US 9,034,763 B2
(45) Date of Patent: May 19, 2015

(54) SLOPED STRUCTURE, METHOD FOR MANUFACTURING SLOPED STRUCTURE, AND SPECTRUM SENSOR

(75) Inventor: Takahiko Yoshizawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 20 days.

(21) Appl. No.: 13/541,311

(22) Filed: Jul. 3, 2012

(65) Prior Publication Data
US 2013/0026590 A1 Jan. 31, 2013

(30) Foreign Application Priority Data
Jul. 27, 2011 (JP) ................................. 2011-164537

(51) Int. Cl.
| | | |
|---|---|---|
| *H01L 29/06* | (2006.01) | |
| *H01L 31/0232* | (2014.01) | |
| *H01L 21/306* | (2006.01) | |
| *G01J 3/427* | (2006.01) | |
| *B81C 1/00* | (2006.01) | |
| *G01J 3/51* | (2006.01) | |
| *G01J 3/02* | (2006.01) | |

(52) U.S. Cl.
CPC .............. *G01J 3/427* (2013.01); *B81C 1/00007* (2013.01); *B81C 1/0015* (2013.01); *B81C 1/00126* (2013.01); *G01J 3/513* (2013.01); *G01J 3/0291* (2013.01); *G01J 3/0278* (2013.01)

(58) Field of Classification Search
CPC ............ B81C 1/00007; B81C 1/00157; B81C 1/001037; B81C 1/00111; B81C 1/00126
USPC ........................................................... 438/702
See application file for complete search history.

(56) References Cited

U.S. PATENT DOCUMENTS

| | | | |
|---|---|---|---|
| 7,728,395 B2 * | 6/2010 | Yang et al. | .................... 257/415 |
| 7,850,441 B2 | 12/2010 | Usa et al. | |
| 2009/0133804 A1 | 5/2009 | Kanematsu et al. | |
| 2011/0215432 A1 | 9/2011 | Uematsu et al. | |
| 2011/0216315 A1 | 9/2011 | Uematsu et al. | |
| 2011/0233388 A1 | 9/2011 | Nakamura | |
| 2011/0233703 A1 | 9/2011 | Nakamura | |
| 2011/0244190 A1 * | 10/2011 | Yoshizawa | .................... 428/166 |

FOREIGN PATENT DOCUMENTS

| | | |
|---|---|---|
| JP | A-6-129908 | 5/1994 |
| JP | 2004-306217 A | 11/2004 |
| JP | 2004-306218 A | 11/2004 |
| JP | A-2005-331651 | 12/2005 |
| JP | A-2007-98930 | 4/2007 |
| JP | A-2007-226075 | 9/2007 |
| JP | A-2008-142895 | 6/2008 |
| JP | A-2009-271468 | 11/2009 |

(Continued)

*Primary Examiner* — Tom Thomas
*Assistant Examiner* — John Bodnar
(74) *Attorney, Agent, or Firm* — Oliff PLC

(57) ABSTRACT

A method for manufacturing a sloped structure is disclosed. The method includes the steps of: (a) forming a sacrificial film above a substrate; (b) forming a first film above the sacrificial film; (c) forming a second film having a first portion connected to the substrate, a second portion connected to the first film, and a third portion positioned between the first portion and the second portion; (d) removing the sacrificial film; and (e) bending the third portion of the second film after the step (d), thereby sloping the first film with respect to the substrate.

8 Claims, 13 Drawing Sheets

(56) References Cited

FOREIGN PATENT DOCUMENTS

| JP | 2010-030021 A | 2/2010 |
| JP | A-2010-82832 | 4/2010 |
| JP | A-2011-185634 | 9/2011 |
| JP | A-2011-203247 | 10/2011 |
| JP | A-2011-205088 | 10/2011 |
| JP | A-2011-209395 | 10/2011 |
| JP | A-2011-210807 | 10/2011 |
| JP | A-2011-218453 | 11/2011 |

* cited by examiner

SLOPED STRUCTURE, METHOD FOR MANUFACTURING SLOPED STRUCTURE, AND SPECTRUM SENSOR

The entire disclosure of Japanese Patent Application No. 2011-164537, filed Jul. 27, 2011 is expressly incorporated by reference herein.

BACKGROUND

1. Technical Field

The present invention generally relates to micro sloped structures, methods for manufacturing a sloped structure, and spectrum sensors using the sloped structure.

2. Related Art

Spectrum sensors are used in the medical, agricultural and environmental fields for diagnosing and examining objects. For example, in the medical field, a pulse oximeter is used to measure the oxygen saturation of blood, using light absorption of hemoglobin. Also, in the agricultural field, a saccharometer is used to measure the concentration of sugar content of fruits, using light absorption of sugar.

Japanese Laid-open Patent Application HEI 6-129908 (related art) describes a spectroscopic imaging sensor that restricts incident angles of light with an optical fiber that optically connects interference filters and photovoltaic converter elements, thereby restricting the transmission wavelength bandwidth of light to the photovoltaic conversion elements. However, miniaturization of such a spectrum sensor by the related art is difficult.

For example, for manufacturing a small-size spectrum sensor, micro sloped structures need to be formed. However, it has been difficult to manufacture such micro structures according to the related art.

SUMMARY

The invention has been made in view of the technical difficulty described above. Some of aspects of the invention pertain to providing a micro sloped structure, a method for manufacturing a micro sloped structure, and a spectrum sensor using the sloped structure.

In accordance with an embodiment of the invention, a method for manufacturing a sloped structure includes the steps of: (a) forming a sacrificial film above a substrate; (b) forming a first film above the sacrificial film; (c) forming a second film having a first portion connected to the substrate, a second portion connected to the first film, and a third portion positioned between the first portion and the second portion; (d) removing the sacrificial film; and (e) bending the third portion of the second film after the step (d), thereby sloping the first film with respect to the substrate. According to the aspect described above, a micro sloped structure can be readily manufactured with a process having high affinity to a semiconductor device fabrication process.

In accordance with an aspect of the embodiment of the invention, the manufacturing method may preferably further include the step (f), between the step (b) and the step (c), of patterning the sacrificial film and the first film to expose a side surface of the sacrificial film on which the third portion of the second film is formed. According to this aspect, by forming the sacrificial film and the first film and then patterning them, a sloped structure can be formed at any specified location on the substrate.

In accordance with an aspect of the embodiment of the invention, the step (e) may preferably include supplying liquid between the first film and the substrate, and then removing the liquid. According to this aspect, the second film can be bent and the first film can be sloped without having to apply an excessive force to the first film and the second film.

In the embodiment described above, the manufacturing method may preferably further include the step (g), after the step (e), of filling material for a third film between the first film and the substrate. According to this aspect, by forming the third film, the optical characteristic of the sloped structure can be adjusted.

In the embodiment described above, the manufacturing method may preferably further include the step (h), after the step (g), of removing the first film and the second film. According to this aspect, as the first film and the second film are removed, the degree of freedom in selecting material for the first film and the second film can be improved.

In accordance with another embodiment of the invention, a sloped structure includes: a first film located above a substrate and sloped with respect to a first surface of the substrate; and a second film located above the substrate and having a first section connected to the first surface of the substrate, a second section connected to the first film, and a third section connecting the first section with the second section. According to this aspect, a useful optical device using a micro sloped structure can be manufactured. In this embodiment, the third section may preferably have a curved surface.

In accordance with an aspect of the embodiment described above, the second section of the second film may preferably be located above the first film. By this aspect, the number of patterning steps can be reduced compared to the case where the second film is formed below the first film.

In accordance with an aspect of the embodiment described above, the sloped structure may further include a third film between the first film and the substrate. According to this aspect, by forming the third film, the optical characteristic of the sloped structure can be adjusted.

In accordance with still another embodiment of the invention, a spectrum sensor includes an angle restriction filter that restricts an incident direction of passing light, a multilayered film that restricts wavelength of transmitting light or reflecting light according to the incident direction, any one of the sloped structures described above that specifies an inclination angle between the incident direction of light passing through the angle restriction filter and a lamination direction of the multilayered film, and a photodiode that detects light passing through the angle restriction filter and transmitted through or reflected at the multilayered film. According to the embodiment described above, by implementing the sloped structure, a small-size spectrum sensor can be manufactured. It is noted that the term "above" used in the description means a direction opposite to the direction toward the back surface of the substrate with the top surface of the substrate as reference.

DESCRIPTION OF EXEMPLARY EMBODIMENTS

Embodiments of the invention are described in detail below. It is noted that the embodiments described below do not unduly limit the contents of the invention set forth in the scope of patent claims. Also, not all of the compositions described in the embodiments would necessarily be essential for the solution provided by the invention. Furthermore, the same components will be appended with the same reference numbers, and their description will not be repeated.

1. First Embodiment

FIGS. 1-3 are cross-sectional views showing a method for manufacturing a sloped structure in accordance with a first embodiment of the invention. The manufacturing method in accordance with the present embodiment uses the semiconductor processing technology, thereby providing a low-cost manufacturing method that can readily achieve device miniaturization.

1-1. Film Formation of First Film

Figure 1A:
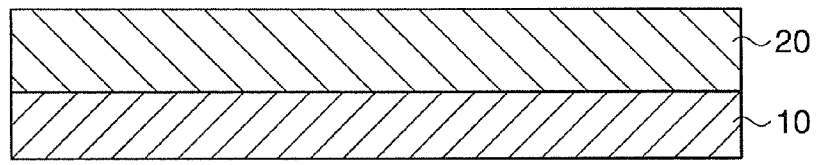
FIGS. 1A-1D are cross-sectional views showing a method for manufacturing a sloped structure in accordance with a first embodiment of the invention.

First, as shown in FIG. 1A, a sacrificial film 20 is formed on a substrate 10. The substrate 10 may be, for example, a single crystal silicon substrate, or a silicon substrate with an angle restriction filter (to be described below) formed thereon. As the sacrificial film 20, for example, a silicon oxide ($SiO_2$) film may be used.

Figure 1B:
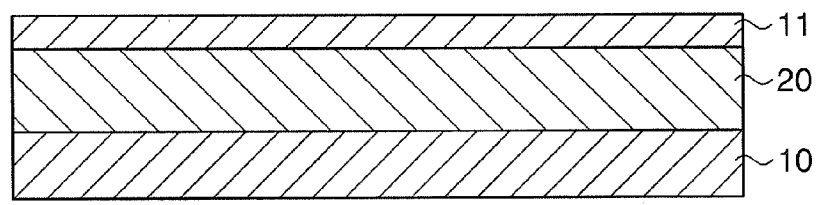

Next, as shown in FIG. 1B, a first film 11 that becomes a film composing sloped structures, is formed on the sacrificial film 20. As the first film 11, for example, a titanium nitride (TiN) film may be used.

Figure 1C:
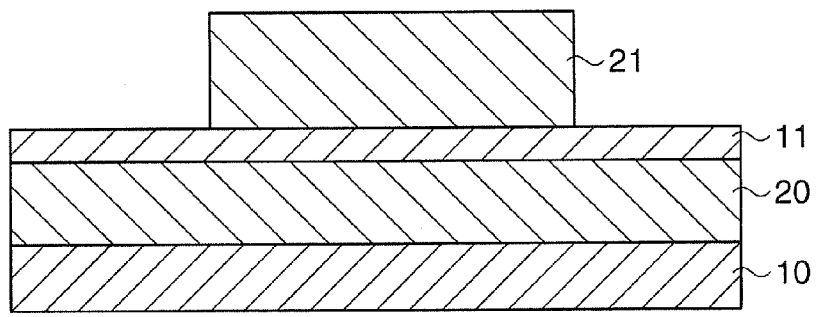
Figure 1D:
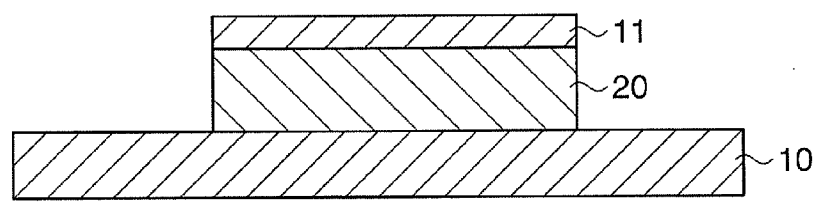

Next, as shown in FIG. 1C, a resist film 21 is formed on the first film 11, and the resist film 21 is patterned into a predetermined shape (for example, a rectangular shape), by exposing and developing the resist film 21. Then, as shown in FIG. 1D, the first film 11 and the sacrificial film 20 are etched, using the resist film 21 as an etching mask. By this step, the first film 11 and the sacrificial film 20 are patterned into the same shape as the predetermined shape (for example, a rectangular shape). Thereafter, the resist film 21 is removed.

In the steps described above, the first film 11 is formed, and then the first film 11 and the sacrificial film 20 are concurrently patterned. However, without any particular limitation to the above, the sacrificial film 20 may be patterned first, and then the first film 11 may be formed on the sacrificial film 20.

1-2. Film Formation of Second Film

Figure 2E:
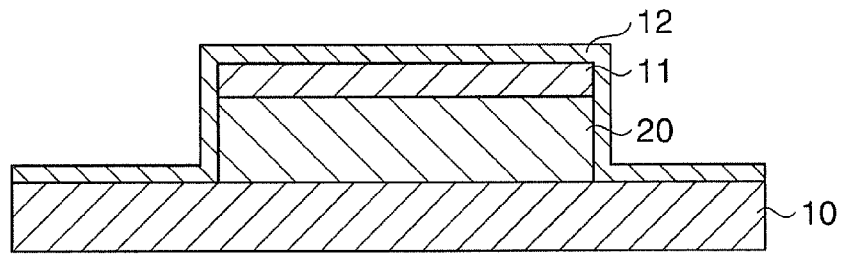
FIGS. 2E-2H are cross-sectional views showing the method for manufacturing a sloped structure in accordance with the first embodiment of the invention.

Next, as shown in FIG. 2E, a second film 12 that serves as a film for composing a sloped structure is formed in a manner to cover the top surface of the first film 11, the top surface of the substrate 10 exposed in the step shown in FIG. 1D, and the side surface of the sacrificial film 20 and the side surface of the first film 11 which are exposed by the step shown in FIG. 1D. The second film 12 may be formed by, for example, a physical vapor deposition (PVD) method including a sputter method, a vacuum deposition method, or the like, or a chemical vapor deposition (CVD) method. As the second film 12, for example, an aluminum (Al) film may be used.

Figure 2F:
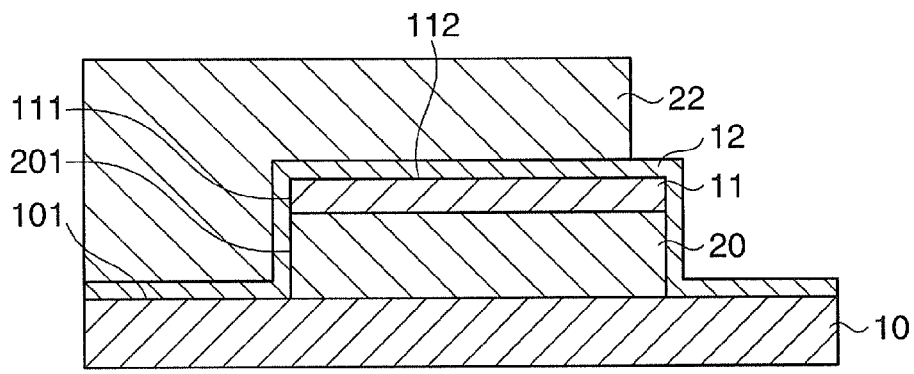

Next, as shown in FIG. 2F, a resist film 22 is formed on the second film 12, and the resist film 22 is subject to exposure and development thereby being patterned into a predetermined shape. In this instance, the resist 22 is patterned into a shape that covers one side surface 201 of the sacrificial film 20, one side surface 111 of the first film 11, a partial region 112 of the top surface of the first film 11 that connects to its side surface, and a partial region 101 of the top surface of the substrate 10.

Figure 2G:
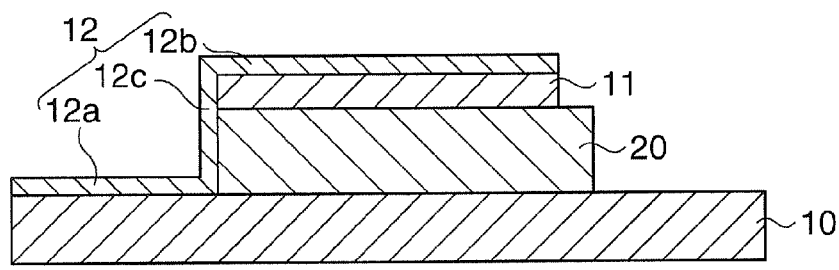

Next, the second film 12 and the first film 11 are etched, using the resist film 22 as an etching mask, as shown in FIG. 2G. By this etching, the second film 12 is substantially removed, while leaving a first portion 12a connected to the substrate 10, a second portion 12b connected to the first film 11, and a third portion 12c extending along one side surface of the sacrificial film 20. Thereafter, the resist film 22 is removed.

Figure 2H:
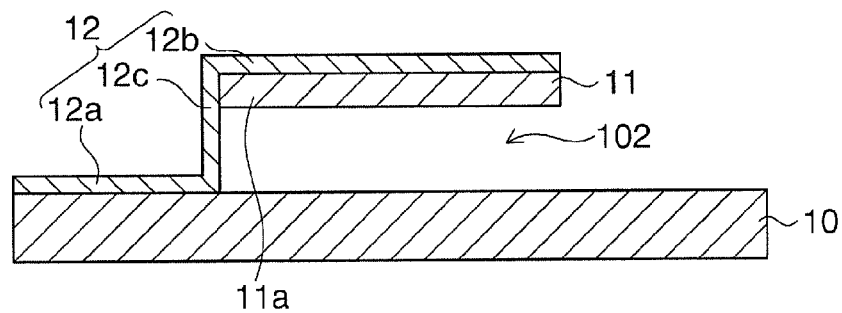

Next, as shown in FIG. 2H, the sacrificial film 20 is removed by, for example, wet etching. When the sacrificial film 20 is composed of, for example, silicon oxide, for example, hydrofluoric acid (HF) may be used as the etching liquid for removing the sacrificial film 20.

By removing the sacrificial film 20, a space 102 is formed between the substrate 10 and the first film 11. The first portion 12a of the second film 12 is connected to the substrate 10, and the second portion 12b of the second film 12 is connected to the entire top surface of the first film 11. The third portion 12c of the second film 12 is located between the first portion 12a and the second portion 12b, thereby supporting the first film 11.

In the example described above, the second portion 12b of the second film 12 is located above the first film 11. However, without any particular limitation to the example, the second portion 12b of the second film 12 may be located below the first film 11. For example, a second film 12 may be formed on the top surface and the side surface of a sacrificial film 20 that has been patterned and then the second film 12 may be patterned. Thereafter, a first film 11 may be formed on the second film 12 located above the sacrificial film 20.

Also, in the example described above, the second portion 12b of the second film 12 is connected to the entire top surface of the first film 11. However, without any particular limitation to the example, the second portion 12b of the second film 12 may be connected at least to a first end section 11a of the first film 11.

1-3. Formation of Slope

Figure 3I:
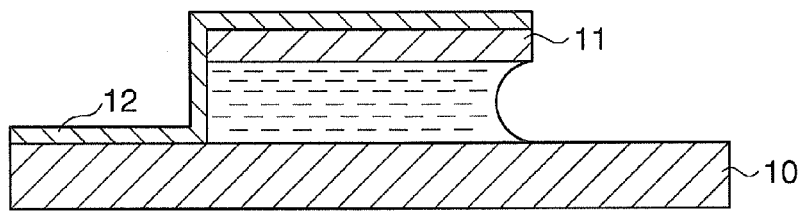
FIGS. 3I-3M are cross-sectional views showing the method for manufacturing a sloped structure in accordance with the first embodiment of the invention.

Next, as shown in FIG. 3I, liquid is supplied in the space between the substrate 10 and the first film 11. For example, the substrate 10, the first film 11 and the second film 12 may be submerged in liquid having large surface tension (for example, water) stored in a container (not shown), and thereafter removed from the container.

Figure 3J:
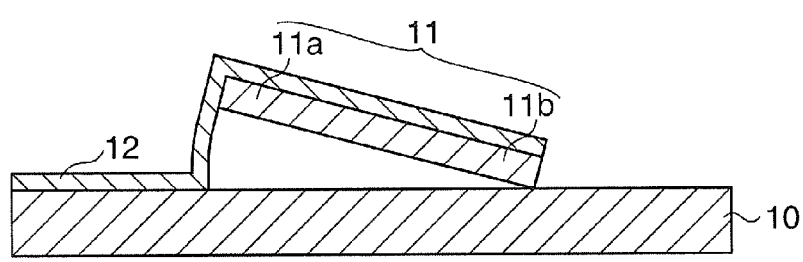

Next, as shown in FIG. 3J, the liquid supplied in the space between the substrate 10 and the first film 11 is evaporated. In this instance, the liquid supplied in the space between the substrate 10 and the first film 11 pulls the second end portion 11b of the first film 11 toward the substrate 10 by its surface tension. As the liquid supplied in the space between the substrate 10 and the first film 11 evaporates, the liquid in the space reduces. By this, the second film 12 is bent, thereby tilting the first film 11. The second film 12 may be folded. The first film 11 may preferably be sloped until the second end portion 11b of the first film 11 comes in contact with the substrate 10. More preferably, the second end portion 11b and the substrate 10 may adhere to each other by sticking. The "sticking" is a phenomenon in which a substrate and a structure or structures surrounding liquid adhere to each other by the meniscus force generated by the surface tension that works when the liquid evaporates. By the steps described above, a first sloped structure including the first film 11 and the second film 12 is formed.

Figure 3K:
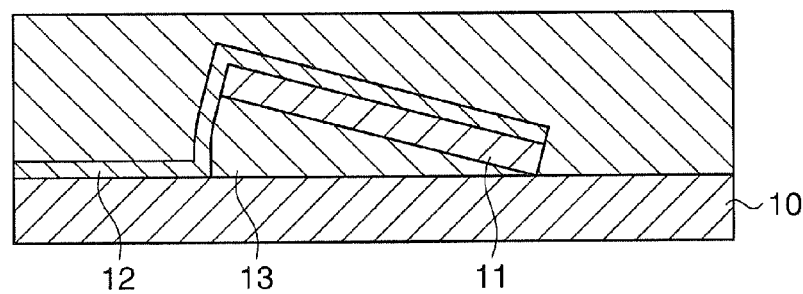

Further, as shown in FIG. 3K, liquid material for a third film 13 is filled between the first film 11 and the substrate 10, if necessary. Thereafter, the liquid material is solidified by means of heating or the like. As the liquid material for forming the third film, for example, SOG (spin on glass) may be used.

Figure 3L:
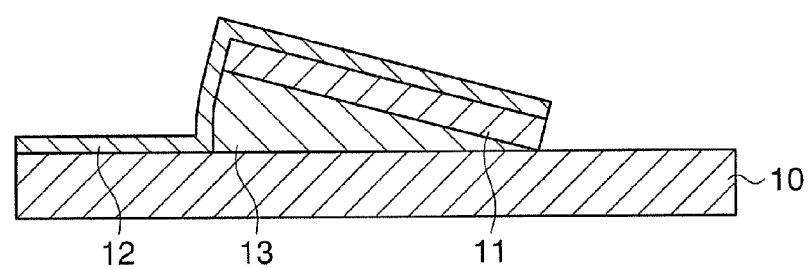

Next, as shown in FIG. 3L, among the solidified liquid material, portions on the second film 12 are removed by anisotropic etching. By the steps described above, a second sloped structure including the first film 11, the second film 12 and the third film 13 is formed.

Figure 3M:
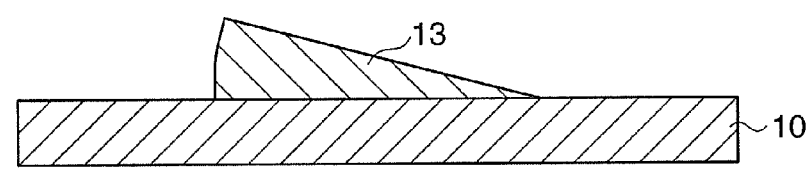
Figure 4A:
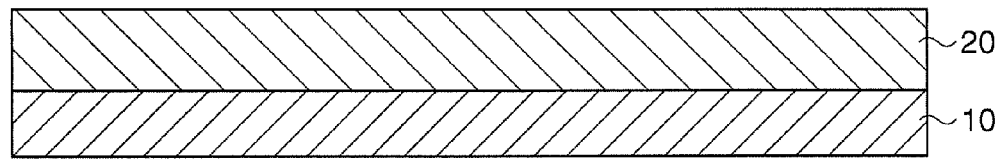
FIGS. 4A-4D are cross-sectional views showing a method for manufacturing a sloped structure in accordance with a second embodiment of the invention.
Figure 4B:
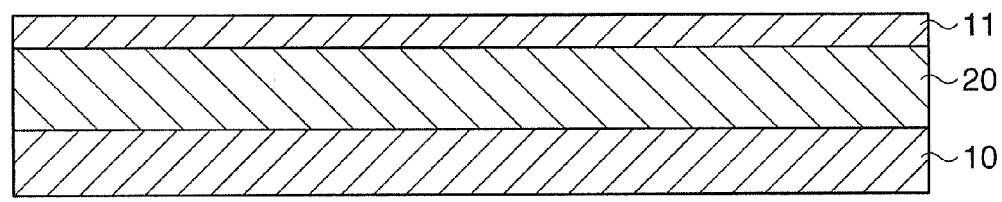
Figure 4C:
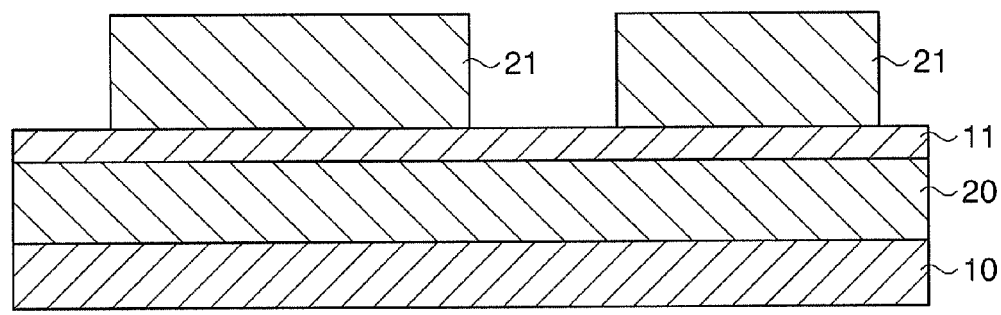
Figure 4D:
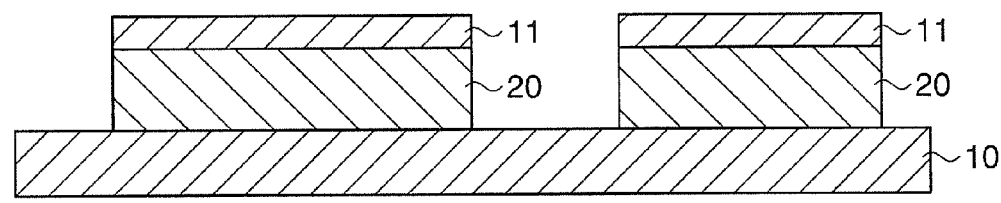
Figure 5E:
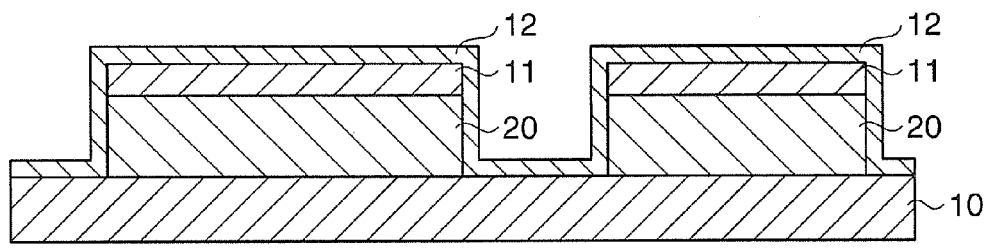
FIGS. 5E-5H are cross-sectional views showing the method for manufacturing a sloped structure in accordance with the second embodiment of the invention.
Figure 5F:
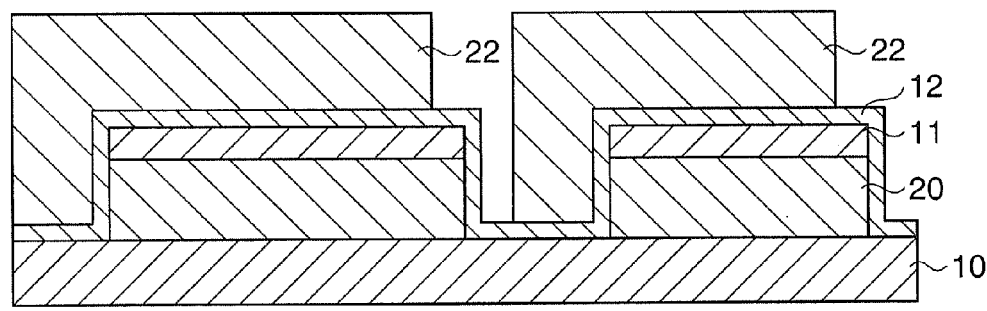
Figure 5G:
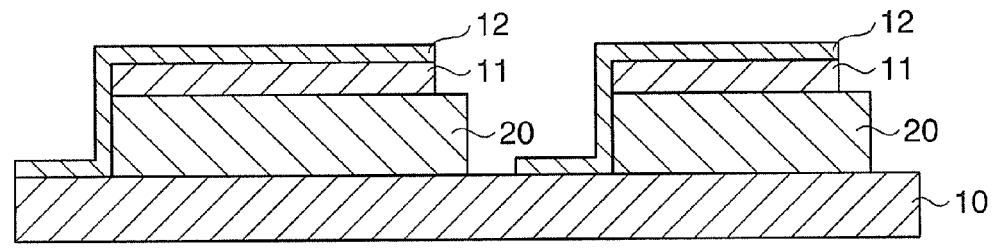
Figure 5H:
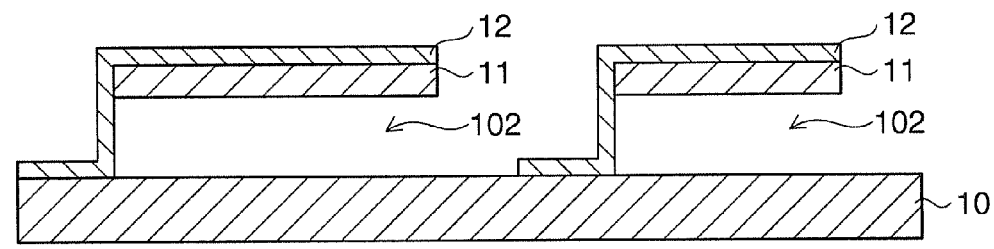
Figure 6I:
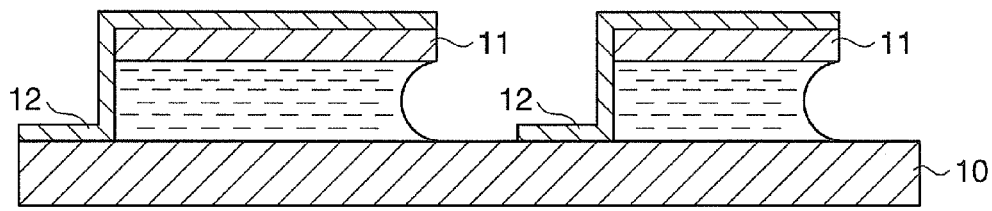
FIGS. 6I-6M are cross-sectional views showing the method for manufacturing a sloped structure in accordance with the second embodiment of the invention.
Figure 6J:
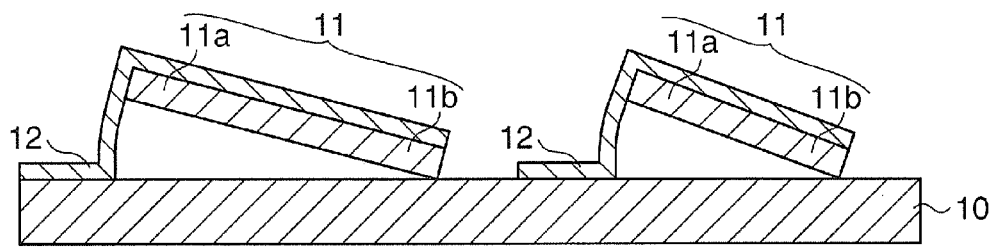
Figure 6K:
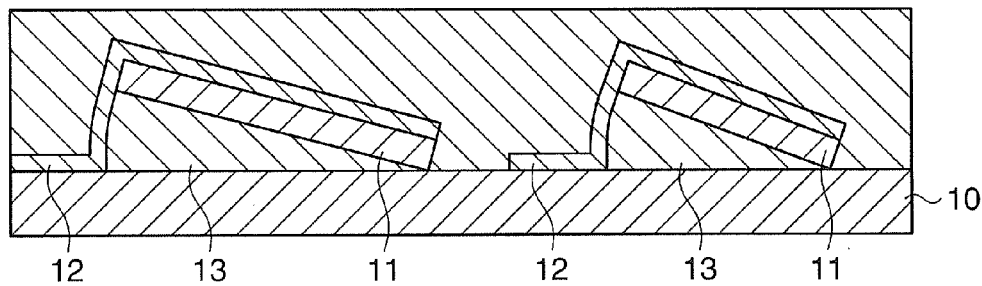
Figure 6L:
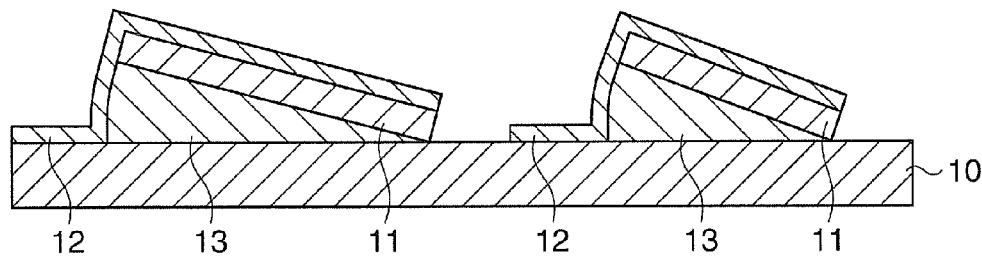
Figure 6M:
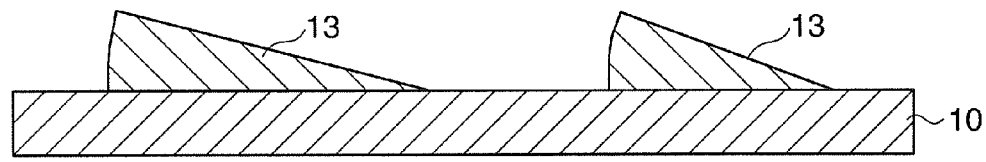
Figure 7A:
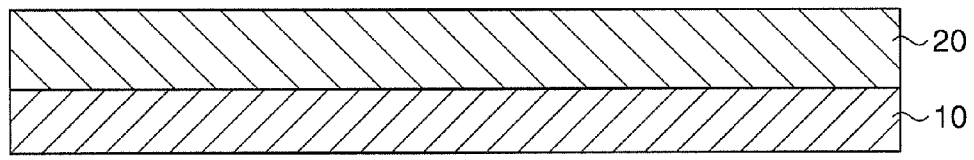
FIGS. 7A-7D are cross-sectional views showing a method for manufacturing a sloped structure in accordance with a third embodiment of the invention.
Figure 7B:
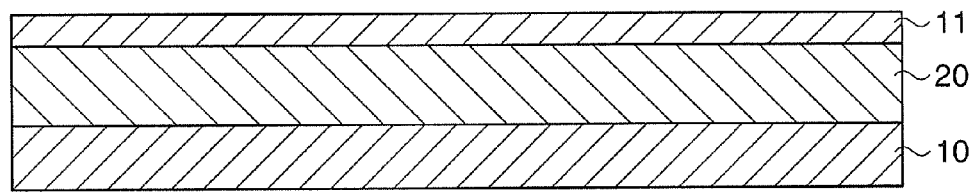
Figure 7C:
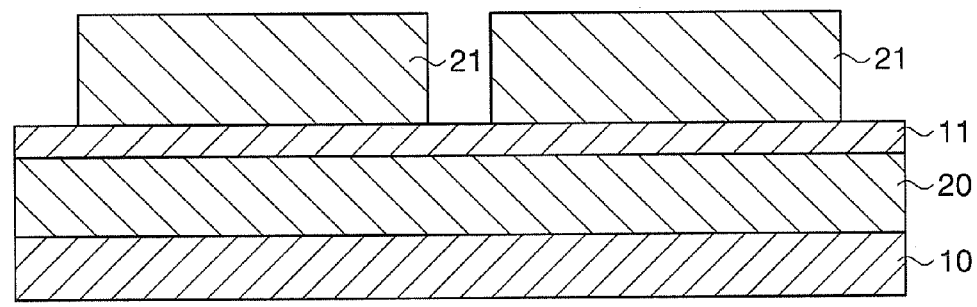
Figure 7D:
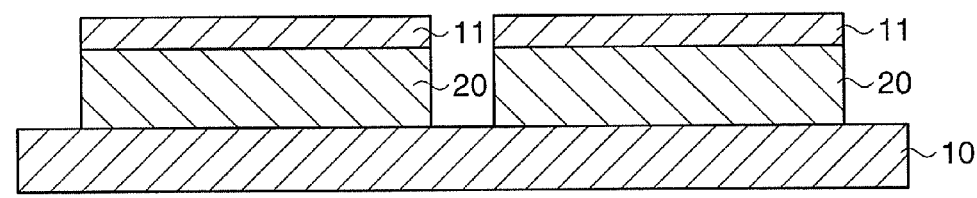
Figure 8E:
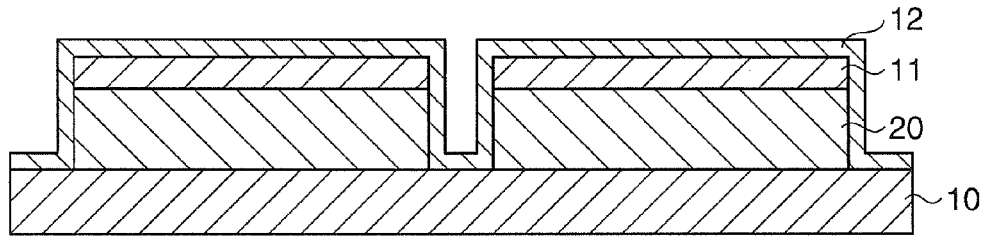
FIGS. 8E-8H are cross-sectional views showing the method for manufacturing a sloped structure in accordance with the third embodiment of the invention.
Figure 8F:
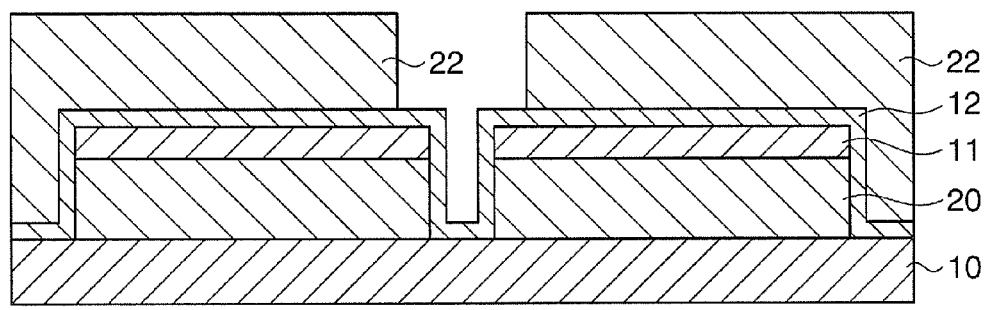
Figure 8G:
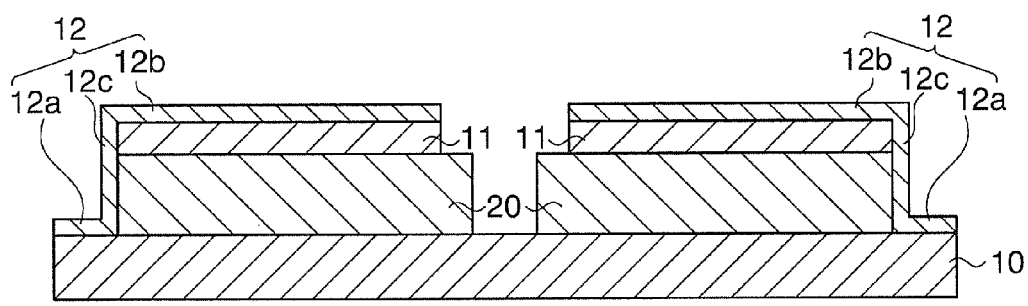
Figure 8H:
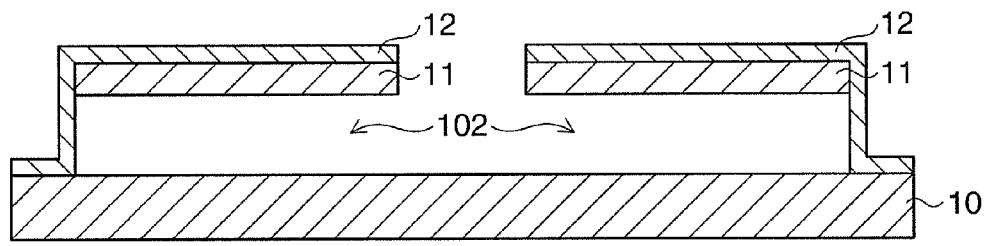
Figure 9I:
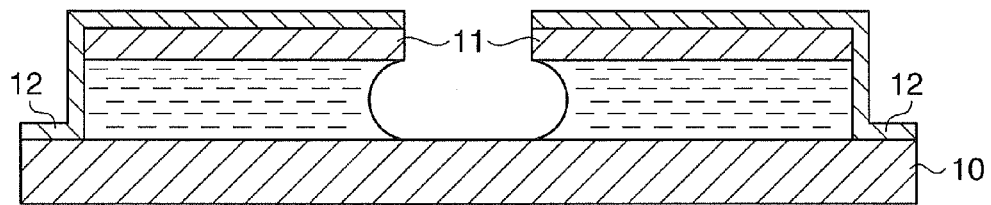
FIGS. 9I-9M are cross-sectional views showing the method for manufacturing a sloped structure in accordance with the third embodiment of the invention.
Figure 9J:
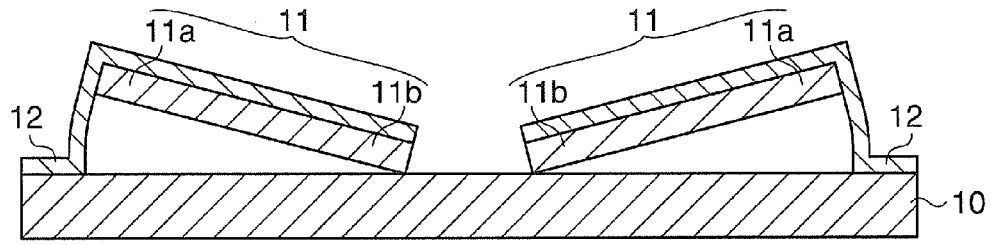
Figure 9K:
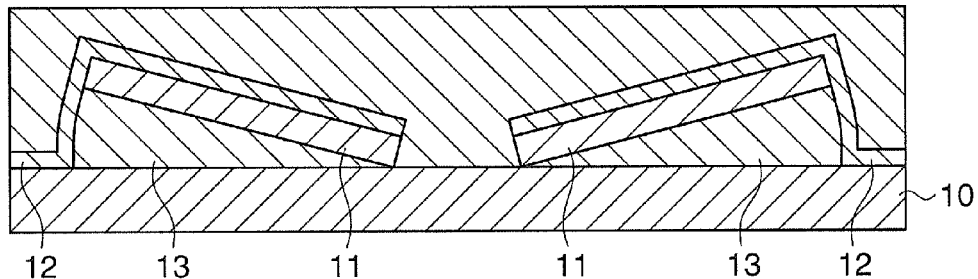
Figure 9L:
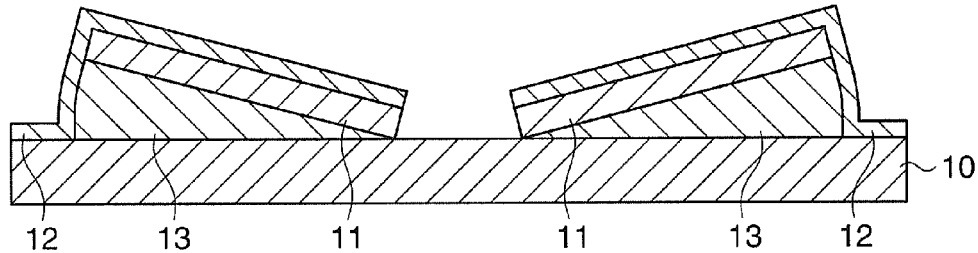
Figure 9M:

Further, as shown in FIG. 3M, the first film 11 and the second film 12 may be removed by etching, if necessary. When the first film 11 is, for example, a titanium nitride film and the second film 12 is, for example, an aluminum film, aqueous ammonia/hydrogen peroxide mixture (NH$_4$OH+ H$_2$O$_2$) may be used as the etching liquid for removing the first film 11 and the second film 12. By removing the first film 11 and the second film 12, a third sloped structure including only the third film 13 is formed.

In the example described above, the first film 11 and the second film 12 are mutually independent films. However, without any particular limitation to the example, the first film 11 and the second film 12 may be formed from a one-piece film. When the rigidity of at least a portion of the second film 12 is smaller than the rigidity of the first film 11, the second film 12 may be bent in the steps in FIG. 3I and FIG. 3J, thereby forming the sloped structure. The sloped structure may be formed by folding the second film 12.

In the steps described above, the substrate 10 is a silicon substrate, the sacrificial film 20 is a silicon oxide film, the first film 11 is a titanium nitride film, the second film 12 an aluminum film, the etching liquid for removing the sacrificial film 20 is hydrofluoric acid, the third film 13 is SOG, and the etching liquid for removing the first film 11 and the second film 12 is aqueous ammonia/hydrogen peroxide mixture. However, the invention is not limited to the above, and the following combinations are possible.

For example, the substrate 10 may be a silicon substrate, the sacrificial film 20 may be a titanium nitride and aluminum film, the first film 11 and the second film 12 may be silicon nitride (Si$_3$N$_4$) film, the etching liquid for removing the sacrificial film 20 may be aqueous ammonia/hydrogen peroxide mixture, the third film 13 may be SOG, and the etching liquid for removing the first film 11 and the second film 12 may be phosphoric acid (H$_3$PO$_4$).

Also, for example, the substrate 10 may be a silicon substrate, the sacrificial film 20 may be a silicon oxide film, the first film 11 and the second film 12 may be made of resist material, the etching liquid for removing the sacrificial film 20 may be hydrofluoric acid, the third film 13 may be SOG, and the etching liquid for removing the first film 11 and the second film 12 may be white fuming nitric acid.

Furthermore, for example, the substrate 10 may be a silicon nitride film, the sacrificial film 20 may be a silicon oxide film, the first film 11 may be a titanium nitride film, the second film 12 may be an aluminum film, the etching liquid for removing the sacrificial film 20 may be hydrofluoric acid, the third film 13 may be SOG, and the etching liquid for removing the first film 11 and the second film 12 may be aqueous ammonia/ hydrogen peroxide mixture.

1-4. Effect of Embodiments

According to the manufacturing process described above, by using film formation, exposure, development, etching techniques, and the like which have high affinity to a semiconductor device fabrication process, sloped structures can be manufactured. Accordingly, the invention makes it easier to mix and mount sloped structures and semiconductor circuits on a single chip.

Also, the slope angle of the sloped structure can be finely adjusted by the length from the first end portion 11a of the first film 11 to the second end portion 11b, and the height of the first film from the substrate 10 (the thickness of the sacrificial film 20).

Further, it is not necessary to make metal molds, which are expensive and quickly worn down, for manufacturing sloped structures, and it is not necessary to remake metal molds for changing the shape of the sloped structures. Moreover, according to the manufacturing process described above, micro sloped structures can be manufactured not only with materials that can be formed by metal molds, but also with any one of other various materials.

2. Second Embodiment

FIGS. 4-6 are cross-sectional views showing a method for manufacturing a sloped structure in accordance with a second embodiment of the invention. The manufacturing method in accordance with the second embodiment pertains to a method by which a plurality of sloped structures having different slope angles can be concurrently manufactured on a single substrate 10.

Steps shown in FIGS. 4-6 are generally the same in many respects as those shown in FIGS. 1-3. However, as shown in FIG. 4C and FIG. 4D, the process in accordance with the second embodiment is different from the process shown in FIGS. 1-3 in that a plurality of resist films 21 having different areas are formed on a first film 1, and a plurality of first films 11 having different lengths are formed.

Then, sloped structures are formed in a manner similar to the process shown in FIGS. 1-3, such that a plurality of sloped structures having different slope angles can be formed according to the length from the first end section 11a to the second end section 11b of each of the first films 11.

3. Third Embodiment

FIGS. 7-9 are cross-sectional views showing a method for manufacturing a sloped structure in accordance with a third embodiment of the invention. The manufacturing method in accordance with the third embodiment pertains to a method by which a plurality of sloped structures having different slope orientations can be concurrently manufactured on a single substrate 10.

Steps shown in FIGS. 7-9 are generally the same in many respects as those shown in FIGS. 1-3. However, as shown in FIG. 8F and FIG. 8G, the process in accordance with the third embodiment is different from the process shown in FIGS. 1-3 in that resist films 22 are formed in a manner to cover side surfaces of a plurality of sacrificial films 20 which face mutually different directions, and a plurality of second films 12 are formed in a manner that second portions 12b of the second films 12 face mutually different directions.

Then, sloped structures are formed in a manner similar to the process shown in FIGS. 1-3, such that a plurality of sloped structures having different slope orientations can be formed according to the orientations of the second portions 12b of the second films 12.

4. Configuration Examples of Sloped Structures 4-1. First Configuration Example

Figure 10A:
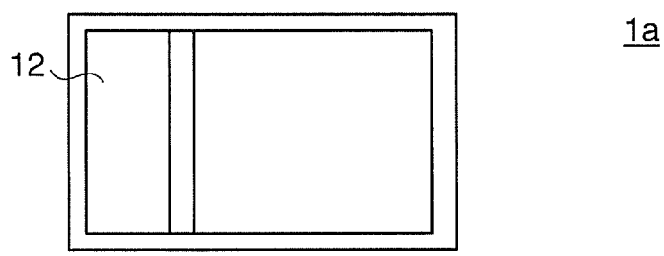
FIGS. 10A-10D are views showing a first configuration example of the sloped structure in each of the embodiments.
Figure 10B:
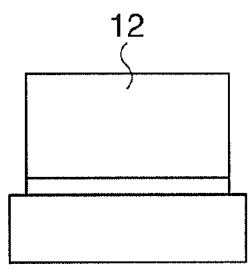
Figure 10C:
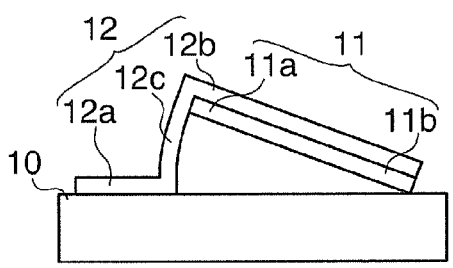
Figure 10D:
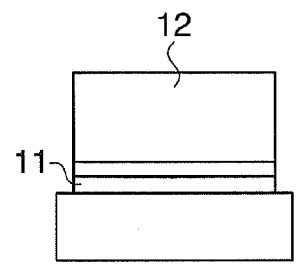

FIGS. 10A-10D are views showing a first configuration example of the sloped structure in each of the embodiments. FIG. 10A is a plan view, FIG. 10B is a rear side view, FIG. 10C is a side view, and FIG. 10D is a front view. As shown in FIGS. 10A-10D, a sloped structure 1a in accordance with the first configuration example includes a first film 11 and a second film 12 located above a substrate 10.

The first film 11 is sloped with respect to the substrate 10, and includes a first end section 11a spaced a longer distance from the substrate 10 and a second end section 11b spaced a shorter distance from the substrate 10. In the first configuration example, the second end section 11b of the first film 11 is in contact with the substrate 10.

The second film 12 includes a first portion 12a connected to the substrate 10, a second portion 12b connected to the top surface of the first film 11, and a third portion 12c located between the first portion 12a and the second portion 12b and has a curved surface. The curved surface may be made of a bent surface.

4-2. Second Configuration Example

Figure 11A:
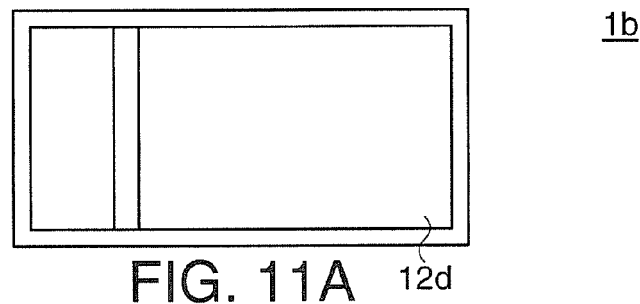
FIGS. 11A-11D are views showing a second configuration example of the sloped structure in each of the embodiments.
Figure 11B:
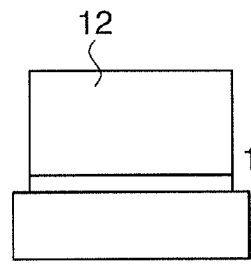
Figure 11C:
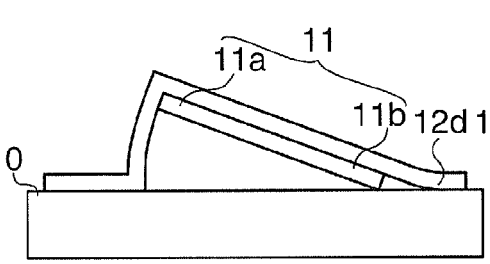
Figure 11D:
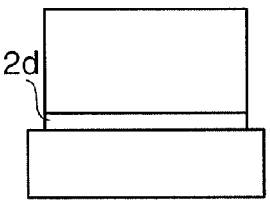

FIGS. 11A-11D are views showing a second configuration example of the sloped structure in each of the embodiments. FIG. 11A is a plan view, FIG. 11B is a rear side view, FIG. 11C is a side view, and FIG. 11D is a front view. As shown in FIGS. 11A-11D, a sloped structure 1b in accordance with the second configuration example is different from that of the first configuration example in that the second film 12 includes a fourth portion 12d that protrudes farther than the second end section 11b of the first film 11.

The fourth portion 12d of the second film 12 contacts the substrate 10, and more preferably adhere to the substrate 10 by sticking. According to the second configuration example, the fourth portion 12d provides a large contact surface with the substrate 10, such that the sloped structure can be stabilized.

4-3. Third Configuration Example

Figure 12A:
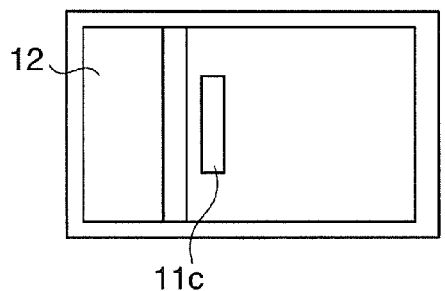
FIGS. 12A-12D are views showing a third configuration example of the sloped structure in each of the embodiments.
Figure 12B:
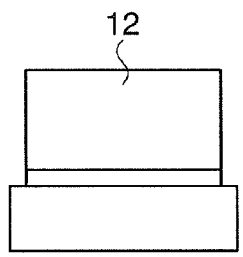
Figure 12C:
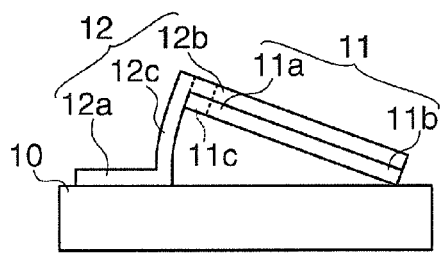
Figure 12D:
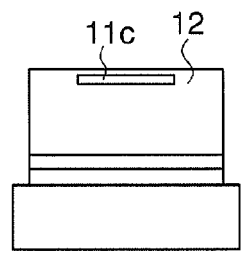

FIGS. 12A-12D are views showing a third configuration example of the sloped structure in each of the embodiments. FIG. 12A is a plan view, FIG. 12B is a rear side view, FIG. 12C is a side view, and FIG. 12D is a front view. As shown in FIGS. 12A-12D, a sloped structure 1c in accordance with the third configuration example is different from that of the first configuration example in that a through-hole 11c is formed in the first end portion 11a of the first film 11 and the second portion 12b of the second film 12.

According to the third configuration example, air can escape through the through-hole 11c when liquid material for the third film 13 is filled between the first film 11 and the substrate 10, such that a sloped structure with few air pockets can be formed.

4-4. Fourth Configuration Example

Figure 13A:
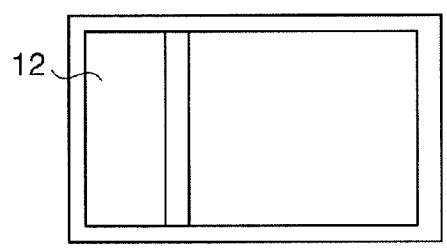
FIGS. 13A-13D are views showing a fourth configuration example of the sloped structure in each of the embodiments.
Figure 13B:
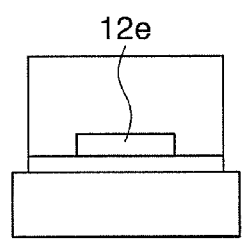
Figure 13C:
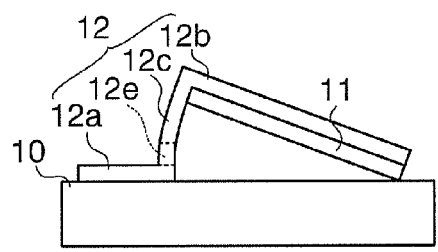
Figure 13D:
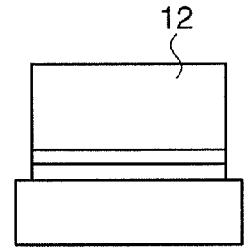

FIGS. 13A-13D are views showing a fourth configuration example of the sloped structure in each of the embodiments. FIG. 13A is a plan view, FIG. 13B is a rear side view, FIG. 13C is a side view, and FIG. 13D is a front view. As shown in FIGS. 13A-13D, a sloped structure 1d in accordance with the fourth configuration example is different from that of the first configuration example in that a through-hole 12e is formed in the third portion 12c of the second film 12.

According to the fourth configuration example, when liquid material for the third film 13 is filled between the first film 11 and the substrate 10, the liquid material may be charged through the through-hole 12e, or air can escape through the through-hole 12e, such that the step of filling liquid material can be smoothly conducted.

4-5. Fifth Configuration Example

Figure 14A:
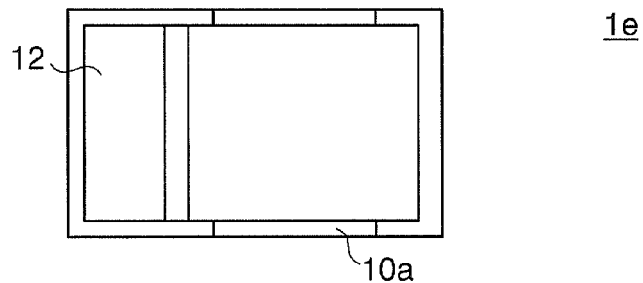
FIGS. 14A-14D are views showing a fifth configuration example of the sloped structure in each of the embodiments.
Figure 14B:
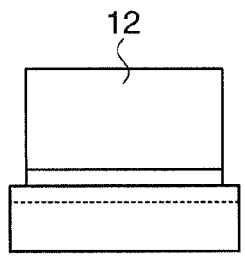
Figure 14C:
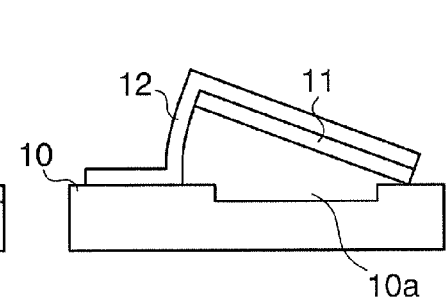
Figure 14D:
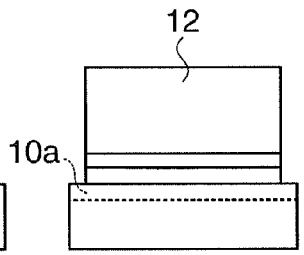

FIGS. 14A-14D are views showing a fifth configuration example of the sloped structure in each of the embodiments. FIG. 14A is a plan view, FIG. 14B is a rear side view, FIG. 14C is a side view, and FIG. 14D is a front view. As shown in FIGS. 14A-14D, a sloped structure 1e in accordance with the fifth configuration example is different from that of the first configuration example in that a groove 10a is formed in the surface of the substrate 10 opposite the first film 11.

According to the fifth configuration example, when liquid material for the third film 13 is filled between the first film 11 and the substrate 10, the liquid material may be charged through the groove 10a, such that the step of filling liquid material can be smoothly conducted.

4-6. Sixth Configuration Example

Figure 15A:
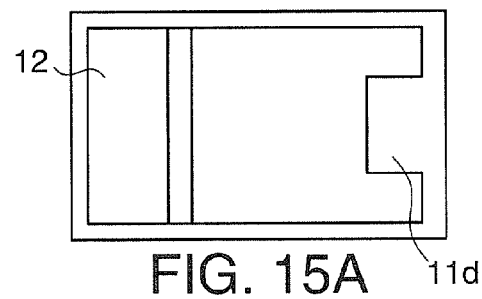
FIGS. 15A-15D are views showing a sixth configuration example of the sloped structure in each of the embodiments.
Figure 15B:
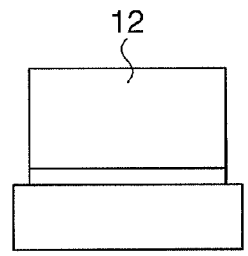
Figure 15C:
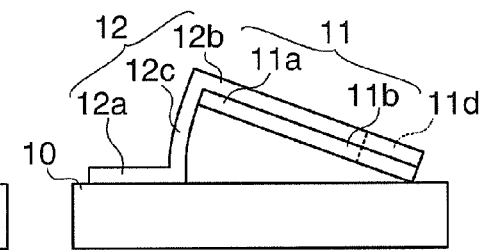
Figure 15D:
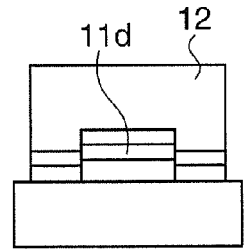

FIGS. 15A-15D are views showing a sixth configuration example of the sloped structure in each of the embodiments. FIG. 15A is a plan view, FIG. 15B is a rear side view, FIG. 15C is a side view, and FIG. 15D is a front view. As shown in FIGS. 15A-15D, a sloped structure 1f in accordance with the sixth configuration example is different from that of the first configuration example in that a concave section 11d is formed in the second end section 11b of the first film 11 and the second portion 12b of the second film 12.

According to the sixth configuration example, when liquid material for the third film 13 is filled between the first film 11 and the substrate 10, the liquid material may be charged through the concave section 11d, or air can escape through the concave section 11d, such that the step of filling liquid material can be smoothly conducted.

5. Transmission Type Spectrum Sensor

Figure 16:
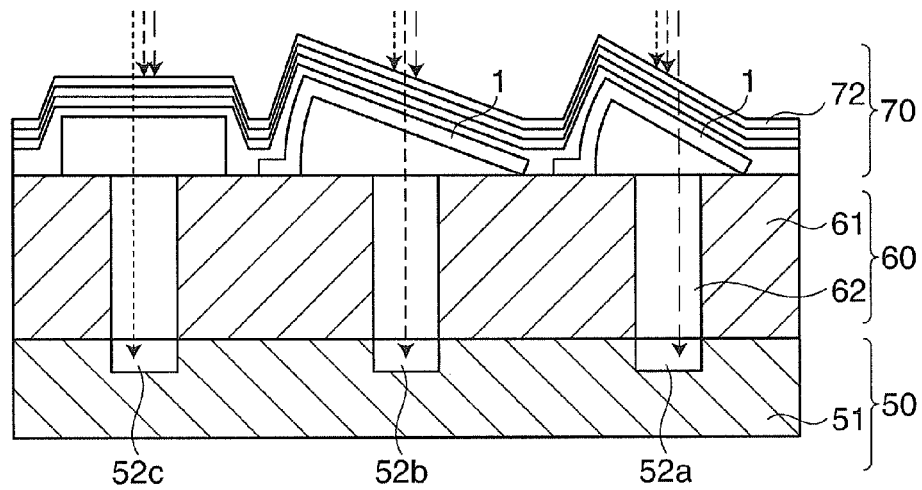
FIG. 16 is a cross-sectional view of a first example of a spectrum sensor in accordance with an embodiment of the invention.

FIG. 16 is a cross-sectional view of a first example of a spectrum sensor using the sloped structure in accordance with an embodiment of the invention. The spectrum sensor shown in FIG. 16 includes an optical device section 50 having photodiodes, an angle restriction filter section 60, and a spectrum filter section 70.

The optical device section 50 is equipped with a substrate 51 formed from semiconductor material such as silicon, and photodiodes 52a, 52b and 52c formed in the substrate 10. Further, the substrate 51 includes an electronic circuit (not shown) formed thereon to perform various operations, such as, applying a predetermined reverse bias voltage to the photodiodes 52a, 52b and 52c, detecting a current based on photoelectric power generated at the photodiodes 52a, 52b and 52*c*, amplifying analog signals according to the magnitude of the current, and converting the analog signals to digital signals.

5-1. Angle Restriction Filter Section

The angle restriction filter section 60 is formed above the substrate 51. The angle restriction filter section 60 includes a shield section 61 that forms optical path walls, and optical paths are formed by transmissive material 62 such as silicon oxide or the like surrounded by the optical path walls. The shield section 61 is formed from material that does not substantially transmit light having wavelengths to be received by the photodiodes 52*a*, 52*b* and 52*c*. The shield section 61 may be formed with a plurality of layers in, for example, a predetermined lattice pattern sequentially deposited on the substrate 51, whereby the optical paths are formed in a direction perpendicular to the surface of the substrate 51.

The incident angle of light passing through the optical paths is restricted by the angle restriction filter section 60. More specifically, when light entered the optical paths is inclined more than a predetermined restriction angle with respect to the direction of the optical paths, the light hits the shield section 61, a portion of the light is absorbed by the shield section 61, and the remaining portion is reflected. The reflection is repeated and the reflected light becomes weaker while the light is passing through the optical paths. Accordingly, light that can pass the angle restriction filter section 60 is substantially limited to light that enters the optical paths at inclinations less than the predetermined restriction angle with respect to the optical paths.

5-2. Spectrum Filter Section

The spectrum filter section 70 includes sloped structures 1 formed on the angle restriction filter section 60, and a multilayer film 72 formed on the sloped structures 1. The multilayer film 72 is formed from thin films of a low refractive index material such as silicon oxide and thin films of a high refractive index material such as titanium oxide, laminated in multiple layers, and slightly inclined with respect to the substrate 51. The thin films of a low refractive index and the thin films of a high refractive index each have a predetermined film thickness, for example, on the order of submicron, and are laminated, for example, in about 60 layers in total, such that the entire multilayer film 72 is, for example, about 6 μm in thickness.

The angle of inclination of the multilayer film 72 with respect to the substrate 51 may be set, for example, between 0 degree and 30 degrees, according to set wavelengths of light to be received by the photodiodes 52*a*, 52*b* and 52*c*. In order to have the multilayer film 72 inclined with respect to the substrate 51, the sloped structures 1 having light transmissivity are formed on the angle restriction filter section 60, and the multilayer film 72 is formed on the sloped structures 1. As the sloped structures 1, sloped structures fabricated by the manufacturing method described above may be used.

According to the structure described above, a portion of incident light that has entered the spectrum filter section 70 becomes reflected light and another portion thereof becomes transmitting light at an interface between a set of the low refractive index thin film and the high refractive index thin film. Then, a portion of the reflected light reflects again at an interface between another set of the low refractive index thin film and the high refractive index thin film, and couples with the aforementioned transmitting light. In this instance, when light has a wavelength that matches with the optical path length of reflected light, the reflected light and the transmitting light match in phase with each other, and thus strengthen each other. When light has a wavelength that does not match with the optical path length of reflected light, the reflected light and the transmitting light do not match in phase with each other, and thus weaken each other (destructively interfere with each other).

Here, the optical path length of reflected light is determined by the angle of inclination of the multilayer film 72 with respect to the direction of the incident light. Accordingly, when the interference action described above is repeated in the multilayer film 72, which is formed from as many as 60 layers in total, light having only specific wavelengths can pass through the spectrum filter section 70, according to the incident angle of incident light, and is emitted from the spectrum filter section 70 at a predetermined emission angle (for example, at the same angle as the incident angle to the spectrum filter section 70).

The angle restriction filter section 60 allows only light incident on the angle restriction filter section 60 in the predetermined range of restriction angles to pass therein. Accordingly, the wavelengths of light that passes through the spectrum filter section 70 and the angle restriction filter section 60 are restricted to a predetermined range of wavelengths, which is determined by the lamination direction of the multilayer film 72, and the incident direction of incident light allowed by the angle restriction filter section 60 to pass.

By forming in advance the sloped structures 1 having angles of inclination that differ depending on the set wavelengths of light to be received by the photodiodes 52*a*, 52*b* and 52*c*, the multilayer film 72 can be formed in the same film thickness by a common process, regardless of the set wavelengths of light to be received by the photodiodes 52*a*, 52*b* and 52*c*.

5-3. Optical Device Section

The photodiodes 52*a*, 52*b* and 52*c* included in the optical device section 50 receive light that has passed through the spectrum filter section 70 and the angle restriction filter section 60, and generate photovoltaic power. The photodiodes 52*a*, 52*b* and 52*c* include impurity regions formed by ion injection or the like in the substrate 51 that is composed of semiconductor material.

As light that has passed through the spectrum filter section 70 and the angle restriction filter section 60 is received by the photodiodes 52*a*, 52*b* and 52*c*, photovoltaic power is generated, whereby an electric current is generated. By detecting the electric current by an electronic circuit (not shown), the light is detected.

5-4. Method for Manufacturing Spectrum Sensor

Here, a method for manufacturing the spectrum sensor in the first example is briefly described. The spectrum sensor is manufactured through initially forming the photodiodes 52*a*, 52*b* and 52*c* on the substrate 51, then forming the angle restriction filter section 60 on the photodiodes 52*a*, 52*b* and 52*c*, and then forming the spectrum filter section 70 on the angle restriction filter section 60.

According to the present embodiment, spectrum sensors can be manufactured in one continuous operation by the semiconductor process, and spectrum sensors using the sloped structures having any desired angles of inclination can be readily formed. Also, by using multiple sloped structures having different angles of inclination, light with multiple wavelengths can be detected.

6. Reflection Type Spectrum Sensor

Figure 17:
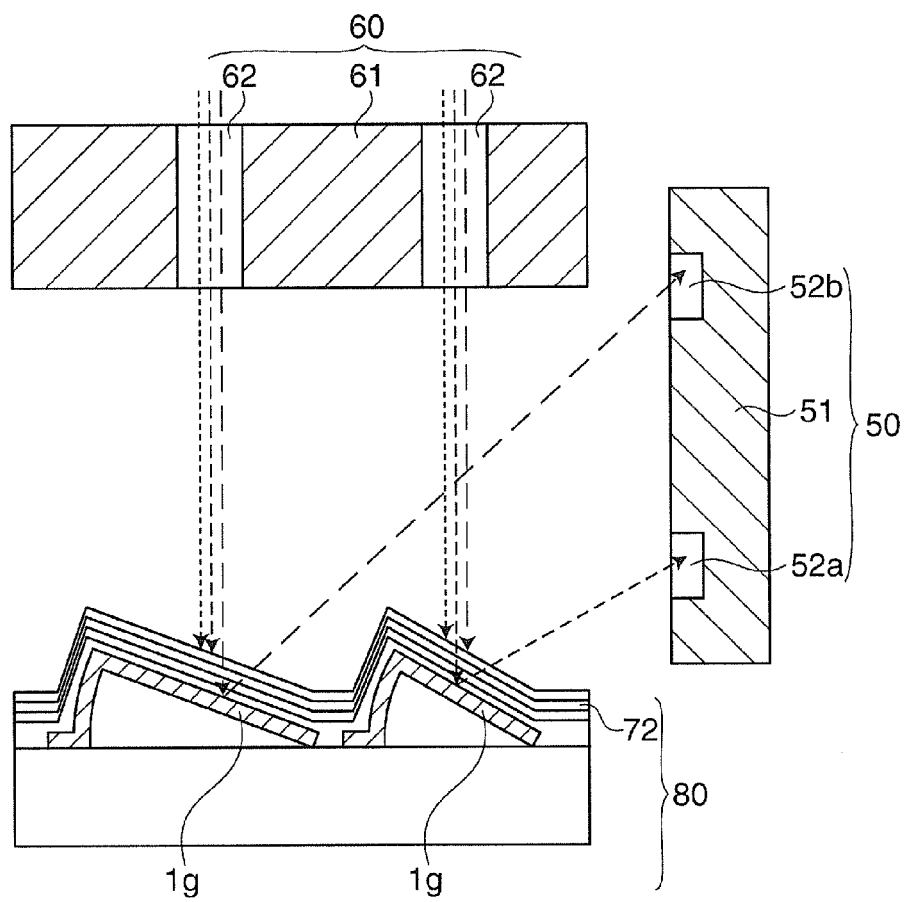
FIG. 17 is a cross-sectional view of a second example of a spectrum sensor in accordance with an embodiment of the invention.

FIG. 17 is a cross-sectional view of a second example of a spectrum sensor using the sloped structure in accordance with any one of the embodiments of the invention. The spectrum sensor shown in FIG. 17 includes an optical device section 50 having photodiodes, an angle restriction filter section 60, and a spectrum filter section 80.

The angle restriction filter section 60 is formed above the spectrum filter section 80. The angle restriction filter section 60 may be formed separated from the spectrum filter section 80, or may be formed in contact with the spectrum filter section 80.

The spectrum filter section 80 includes sloped structures 1g having a high reflection coefficient and a multilayer film 72 formed on the sloped structures 1g. As the sloped structures 1g, sloped structures manufactured by the manufacturing method described above may be used.

According to the structure described above, the spectrum filter section 80 restricts wavelengths of reflecting light according to incident direction of light passing through the angle restriction filter section 60. More specifically, among incident light passed through the angle restriction filter section 60 and entered the spectrum filter section 80, only light having a specified wavelength is reflected by the spectrum filter section 80, according to the incident angle, and is emitted from the spectrum filter section 80 at a predetermined emission angle (for example, at the same angle as the incident angle to the spectrum filter section 80).

By forming in advance the sloped structures 1g having angles of inclination that differ depending on the set wavelengths of light to be received by the photodiodes 52a and 52b, the multilayer film 72 can be formed in the same film thickness by a common process, regardless of the set wavelengths of light to be received by the photodiodes 52a and 52b.

The photodiodes 52a and 52b included in the optical device section 50 receive light that has passed through the angle restriction filter section 60 and reflected by the spectrum filter section 80, and generate photovoltaic power.

As the device that uses the sloped structures, an optical sensor is described above. However, the sloped structure may be used as any one of other types of devices. For example, the sloped structure may be used as an optical device, such as, a prism, a mirror or the like for relaying light signals with a predetermined wavelength in a relay device for optical fibers.

What is claimed is:

1. A method for manufacturing a sloped micro-structure, comprising the steps of:
   (a) forming a sacrificial film above a substrate;
   (b) forming a first film above the sacrificial film;
   (c) forming a second film having a first portion directly contacting the substrate, a second portion connected to the first film, and a third portion positioned between the first portion and the second portion;
   (d) removing the sacrificial film;
   (e) bending the third portion of the second film after the step (d), so that the first film has a sloping surface with respect to an upper surface of the substrate; and
   (g) adding a third film between the first film and the substrate.

2. A manufacturing method according to claim 1, further comprising the step (f, between the step (b) and the step (c), of patterning the sacrificial film and the first film to expose a side surface of the sacrificial film on which the third portion of the second film is formed.

3. A manufacturing method according to claim 1, wherein the step (e) includes supplying liquid between the first film and the substrate, and then removing the liquid.

4. A manufacturing method according to claim 1, further comprising the step (h), after the step (g), of removing the first film and the second film.

5. A sloped micro-structure comprising:
   a first film located above a substrate and sloped with respect to a first surface of the substrate;
   a second film located above the substrate and including a first section directly contacting the first surface of the substrate, a second section connected to the first film, and a third section connecting the first section with the second section; and
   a third film between the first film and the substrate.

6. A sloped structure according to claim 5, wherein the third portion has a curved surface.

7. A sloped structure according to claim 5, wherein the second section of the second film is located above the first film.

8. A spectrum sensor comprising:
   an angle restriction filter that restricts an incident direction of passing light;
   a multilayered film that restricts wavelength of transmitting light or reflecting light according to the incident direction;
   the sloped structure recited in claim 5 that specifies an inclination angle between the incident direction of light passing through the angle restriction filter and a lamination direction of the multilayered film; and
   a photodiode that detects light passing through the angle restriction filter and transmitted through or reflected at the multilayered film.

* * * * *